United States Patent
Cheng et al.

(10) Patent No.: US 11,600,516 B2
(45) Date of Patent: Mar. 7, 2023

(54) DIE EJECTOR HEIGHT ADJUSTMENT

(71) Applicant: ASMPT SINGAPORE PTE. LTD., Singapore (SG)

(72) Inventors: Chi Wah Cheng, Hong Kong (HK); Wan Yin Yau, Hong Kong (HK); Kwok Pun Law, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 242 days.

(21) Appl. No.: 15/930,533

(22) Filed: May 13, 2020

(65) Prior Publication Data
US 2021/0354355 A1   Nov. 18, 2021

(51) Int. Cl.
| | |
|---|---|
| H01L 21/687 | (2006.01) |
| H01L 21/683 | (2006.01) |
| H01L 21/67 | (2006.01) |
| H01L 21/68 | (2006.01) |
| B65G 49/06 | (2006.01) |
| B29C 45/40 | (2006.01) |

(52) U.S. Cl.
CPC ...... *H01L 21/68742* (2013.01); *B65G 49/061* (2013.01); *B65G 49/067* (2013.01); *H01L 21/67132* (2013.01); *H01L 21/67259* (2013.01); *H01L 21/681* (2013.01); *H01L 21/6835* (2013.01); *B29C 45/4005* (2013.01); *H01L 2221/68322* (2013.01); *H01L 2221/68381* (2013.01)

(58) Field of Classification Search
CPC ......... H01L 21/68742; H01L 21/67259; H01L 21/681; H01L 21/67132; H01L 2221/68322; H01L 2221/68381; H01L 21/6835; B65G 49/061; B65G 49/067
See application file for complete search history.

(56) References Cited

U.S. PATENT DOCUMENTS

| | | | |
|---|---|---|---|
| 6,318,986 B1 | 11/2001 | Hinzmann et al. | ............. 425/78 |
| 9,929,036 B2 * | 3/2018 | Kwong | ............... H01L 21/6836 |

(Continued)

FOREIGN PATENT DOCUMENTS

| | | | |
|---|---|---|---|
| KR | 2006117537 A | * | 11/2006 |
| TW | 201946762 A | | 12/2019 |

OTHER PUBLICATIONS

Taiwanese Office Action, dated May 6, 2022, issued in corresponding Taiwanese Patent Application No. 110114461. English translation of Search Report.

*Primary Examiner* — Aaron J Gray
(74) *Attorney, Agent, or Firm* — Ostrolenk Faber LLP (57) ABSTRACT

A die ejection apparatus operable to eject a die from a support has at least two ejector components configured to lift a die located on the support. The ejector components are moveable to a position in which a lifting force is exertable by the ejector components on the support, so as to lift a die located on the support. Movement of the die ejector components is initiated towards the support, and a moment when each of the die ejector components reaches the position is determined. A height offset of each die ejector component relative to a height of another die ejector component is determined upon reaching the said position, and relative heights of the die ejector components are adjusted in dependence upon the evaluated height offset.

15 Claims, 8 Drawing Sheets

(56) References Cited

U.S. PATENT DOCUMENTS

| | | | |
|---|---|---|---|
| 2002/0044864 A1* | 4/2002 | Hyakudomi | H01L 21/682 414/784 |
| 2005/0109229 A1 | 5/2005 | Hasegawa | |
| 2008/0227239 A1* | 9/2008 | Shibata | H01L 21/67132 156/765 |
| 2008/0318346 A1* | 12/2008 | Maki | H01L 24/83 257/E21.53 |
| 2010/0252205 A1* | 10/2010 | Chan | H01L 21/67132 156/707 |

* cited by examiner

| For 1 pin | For 2 pins | For 3 pins | For 4 pins | For 5 pins |
|---|---|---|---|---|
| • | •• | ▬•▬ | (4 pins) | (5 pins) |

FIG. 6C

DIE EJECTOR HEIGHT ADJUSTMENT

FIELD OF THE INVENTION

The invention relates to a method of adjusting a die ejection apparatus operable to eject a die from a support.

BACKGROUND

During the production of semiconductor dice or chips, many semiconductor dice are formed together on a single wafer. That wafer is then cut to separate the individual dice. Each of the semiconductor dice is then individually mounted on to a support surface for further processing. Whilst mounted on the support surface, a range of processes may be carried out on the semiconductor dice or chips.

It will be appreciated that it is often necessary to provide mechanisms to allow for the movement of dice and to separate the die from the support surface or wafer tape, onto which it has been adhered. For example, separation of a die from the support surface often occurs after a wafer mounted on adhesive wafer tape has been singulated into individual dice and the dice need to be picked up and bonded onto another surface.

Ejector apparatus is used to aid the die pick-up process. Such ejector apparatus can be used to maintain stable die pick-up whilst minimizing potential damage to the die during the pick-up process. Typically, ejector apparatus includes various ejector components in the form of multiple ejector pins or blades. Those ejector components are configured to exert a lifting or release force upon die on a support surface, for example, dice located on adhesive wafer tape.

Semiconductor dice or chips are typically delicate, fragile components and exposure to the ejector components of the ejector apparatus may cause damage.

It would be beneficial to provide a method to mitigate the chance of damage to die as a result of use of the ejector apparatus.

SUMMARY OF THE INVENTION

It is thus an object of this invention to seek to provide a method of adjusting a die ejection apparatus which mitigates chances of damage to die occurring as a result of use of the die ejection apparatus.

According to a first aspect of the present invention, there is provided: a method of adjusting a die ejection apparatus operable to eject a die from a support, the method comprising: providing a die ejection apparatus comprising at least two ejector components configured to lift a die located on the support, the ejector components being moveable between: a first position in which no lifting force is exertable by the ejector components on the support; and a position in which a lifting force is exertable by the ejector components on the support, so as to lift a die located on the support in use; the method comprising: initiating movement of the die ejector components from the first position towards the support; determining when each of the die ejector components reaches a second position from the first position; evaluating a height offset of each die ejector component relative to a height of another die ejector component upon reaching the second position from the first position; and adjusting relative heights of the die ejector components in dependence upon the evaluated height offset.

The first aspect recognizes that a problem with existing die ejection apparatus is that misalignment of multiple ejector components may result in an unbalanced lifting force being exertable upon die located on a support during use of ejector apparatus. Ideal configuration of multiple ejector components is such that all of the ejector components are aligned such that in use, the components all make contact with the support simultaneously to exert an even lifting force upon a delicate die located upon the support. Height variations in ejector components can give rise to defects such as: position offset, tilting, or die crack, as a result of the unbalanced lifting and ejection forces. In particular, if a thin die is being lifted by the ejector components, unbalanced lifting forces exerted upon the die by the ejector components can leave that die very vulnerable to cracking or other damage. The invention recognizes that it can be challenging to identify misaligned ejector components and furthermore, even if misalignment is detected, adjustment of the elector components to account for the misalignment can be problematic.

The invention recognizes that accurately calculating height offsets between die ejector components can allow for appropriate adjustment or calibration to be made to the multiple ejector components. That adjustment may allow for any misalignment of, for example, height, of the multiple ejector components to be corrected. Accurate and precise adjustment of the multiple ejector components before the ejector apparatus is used to exert a lifting force upon die located on a support may mitigate the change of damage being caused to the die through use of the ejector apparatus.

Accordingly, a method of adjusting a die ejection apparatus is provided. The die ejection apparatus may be for use ejecting dice or chips formed from a wafer and located on wafer tape. The die ejection apparatus may be configured to eject, lift or separate a die from a support. That support may comprise UV tape or wafer tape. The method may comprise a method of adjusting, calibrating, or initializing physical configuration the die ejection apparatus. The method may comprise providing a die ejection apparatus comprising at least two ejector components. Those ejector components may comprise ejector pins or ejector blades or ejector elements. The ejector components may be configured to lift, release, or support die located on the support. The ejector components may be moveable. The ejector components may be moveable between a first position in which no lifting force is exertable by the ejector components on the support on which the dice or chips are located, and a position in which a lifting force is exertable by the ejector components on that support. In the position in which a lifting force is exertable, the ejector components may be configured to lift or push against the support and therefore lift a die located on the support. In other words, in the first position, no contact between the ejector components and the support is envisaged and the ejector components may be moved from that position to a different position in which the ejector components contact the support and operate to push upon that support, thereby allowing a die located on the support to also be lifted. A method in accordance with the present invention may operate such that movement of the die ejector components is initiated from the first position towards the support. In the first position, the die ejector components may be substantially clear or spaced from the support. The method may comprise the step of determining when each of the die ejector components reaches a second position in from the first position. That second position may be a position in which the ejector components touch the support or may be a different predetermined known position. The method may comprise the step of evaluating an offset of height between die ejector components reaching the second position from the first position. That offset may be determined relative to a height of another die ejector component. That offset may comprise an offset in height, in time or in distance.

In one embodiment, adjusting the relative heights of the die ejector components in dependence upon the evaluated height offset comprises: applying an alignment correction calculated from the evaluated height offset to substantially align the height of an operative surface of the ejector components before initiating any lifting of the die located on the support in use.

In one embodiment, adjusting the relative heights of the die ejector components in dependence upon the evaluated height offset comprises: controlling the subsequent movement of the die ejector components such that the die ejector components reach the second position from the first position substantially simultaneously.

In one embodiment, the height of the operative surface of each of the die ejector components is independently adjustable.

In one embodiment, adjusting the relative heights of the die ejector components in dependence upon the evaluated height offset comprises: manually adjusting a mount for the die ejector components to change a height of one or more of the die ejector components relative to another ejector component.

In one embodiment, adjusting the relative heights of the die ejector components in dependence upon the evaluated height offset comprises: automatic adjustment of position of one or more of the die ejector components with motors coupled to the die ejector components.

In one embodiment, each of the die ejector components is coupled to a separate motor.

In one embodiment, the method further comprises: after adjusting the relative heights of the die ejector components in dependence upon the evaluated height offset, initiating movement of the adjusted die ejector components from the first position to assess whether each of the die ejector components reaches the second position from the first position concurrently to determine a height offset therebetween; and thereafter, repeating the determining, evaluating and adjusting steps if a height offset is detected.

In one embodiment, determining when each of the die ejector components reaches the second position comprises: monitoring a deformation of the support caused by each die ejector component at the second position.

In one embodiment, monitoring comprises: optically monitoring the imprint made by each die ejector component at the second position on a region of the support.

In one embodiment, monitoring comprises: imaging a known region of the support prior to initiation of movement of any of the die ejector components from the first position to obtain an initial image; initiating movement of the die ejector components from the first position towards the support; imaging the known region of the support as the die ejector components move to the second position; comparing the obtained imaged to the initial image and further comparing the respective imprints made by each of the die ejector components on the support for determining their relative heights.

In one embodiment, adjusting the relative heights of the die ejector components comprises: controlling subsequent movement of the die ejector components from the first position to the second position relative to one another.

In one embodiment, controlling subsequent movement of the die ejector components comprises: controlling a speed of movement of each independently controllable die ejector component between the first and second positions to account for the evaluated height offset such that the ejector components concurrently reach the second position.

In one embodiment, controlling subsequent movement of the die ejector components comprises: controlling a time of initiation of movement of each independently controllable die ejector component between the first and second positions.

In one embodiment, controlling subsequent movement of the die ejector components comprises: preventing movement of at least one independently controllable die ejector component until it is aligned with movement of the other die ejector components between the first and second positions to account for the evaluated height offset such that the ejector components concurrently reach the second position.

A second aspect provides a die ejection apparatus operable to lift/eject a die from a support, the apparatus comprising: at least two ejector components configured to lift a die located on the support, the ejector components being moveable between: a first position in which no lifting force is exertable by the ejector component on the support; and a second position in which a lifting force is exertable by the ejector components on the support, so as to lift a die located on the support in use; the apparatus comprising a height offset evaluation unit configured to: initiate movement of the die ejector components from the first position towards the support; determine when each of the die ejector components reaches the second position from the first position; evaluate a height offset of each die ejector component relative to a height of another die ejector component upon reaching the second position from the first position, the evaluated height offset being applied to adjust relative heights of the die ejector components.

In one embodiment, the apparatus further comprises motors coupled to the die ejector components for automatically adjusting the relative heights of the die ejector components.

In one embodiment, each of the die ejector components is coupled to a separate motor.

BRIEF DESCRIPTION OF THE DRAWINGS

Embodiments of the present invention will now be described, by way of example only, with reference to the accompanying drawings, in which:

FIG. 1A and FIG. 1B illustrate schematically general operation of die ejection apparatus, wherein FIG. 1A shows a die before it is lifted and FIG. 1B shows the die being picked up by a pick collet after it has been lifted;

FIG. 6A, FIG. 6B and FIG. 6C illustrate schematically an alternative multistage ejector module for use in a method in accordance with the invention, wherein FIG. 6A is a perspective view of the ejector module, FIG. 6B is a plan view of the ejector module and FIG. 6C illustrates several possible arrangements of ejector components on the ejector module.

In the drawings, like parts are denoted by like reference numerals.

DETAILED DESCRIPTION

Before discussing embodiments in any more detail, a general description of apparatus and methods in accordance with the invention will be provided. Embodiments provide a method of adjusting a die ejection apparatus or module operable to eject a die from a support. Processing of dies or chips typically requires a step of separating a die from a support. That support is typically wafer tape. Ejection apparatus in the form of an ejection module is configured to allow for repeatable and stable die pick-up from wafer tape. Separation of the die from the wafer tape allows for further processing of those die; for example. Successful separation of the die from wafer tape is such that the process mitigates the chance of the ejection process forming defects to the dice, such as die cracks, pin marks and similar defects.

Figure 1A:
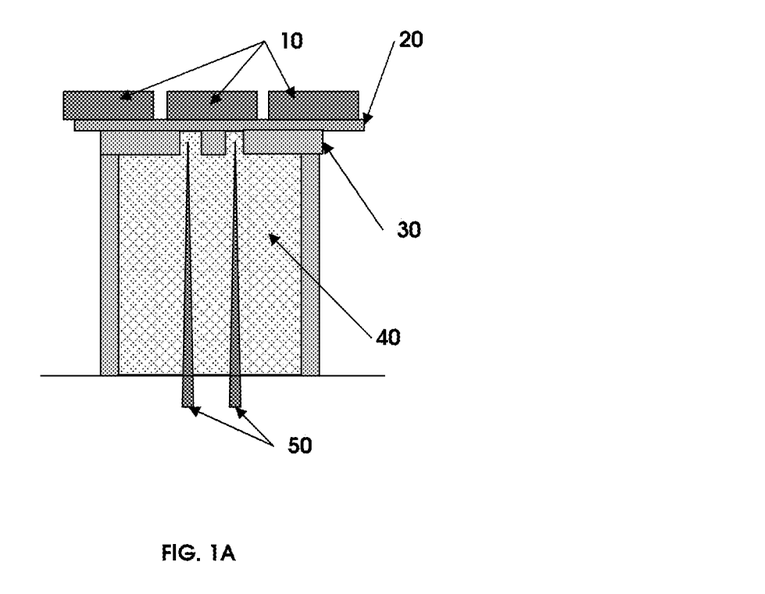
Figure 1B:
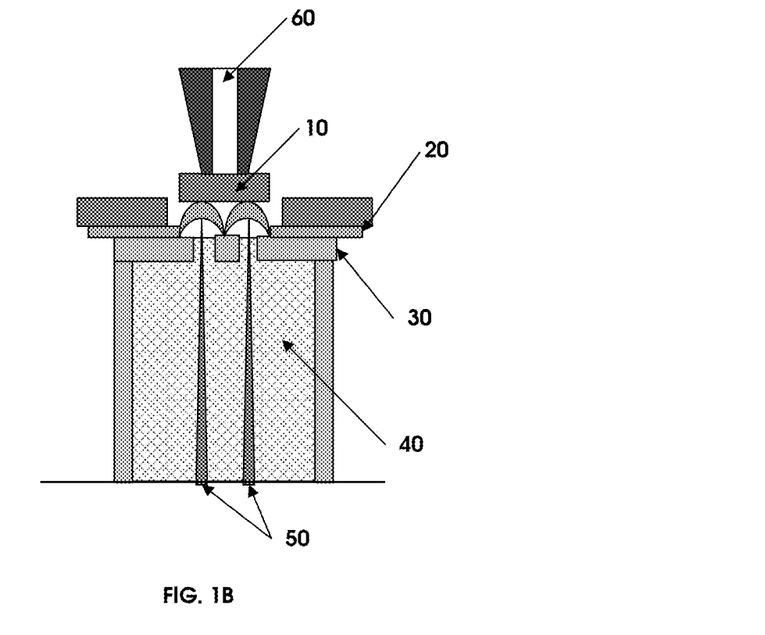

FIG. 1A and FIG. 1B illustrate schematically general operation of typical die ejection apparatus. As shown in FIG. 1A, individual separated dice 10 are located upon a support in the form of UV tape 20. During die pick-up, ejector apparatus comprising an ejector cap 30 operates to hold the UV tape 20 carrying separated dice 10. That holding occurs as a result of a vacuum indicated generally as 40 being applied beneath the UV tape 20. Use of that vacuum force 40 is such that the UV tape 20 and supported die 10 are held in position on the ejector cap 30. The ejector apparatus includes a plurality of ejector components 50, in the form of pins or blades, located within the ejector cap 30. Once the ejector cap 30 is in position holding the UV tape 20 carrying the separated die, movement of the ejector components can be initiated. The ejector components are moved incrementally upwards by means of a motor operating to translate a shared stage (not shown). As the stage pushes the ejector components upwards, those elector components begin to push against the UV tape 20 to create tension on that portion of the UV tape 20. Continued upward movement of the ejector components 50 causes substantial separation of the die 10 from the UV tape 20 and allows for pick-up by a pick collet 60 shown in FIG. 1B.

Figure 2:
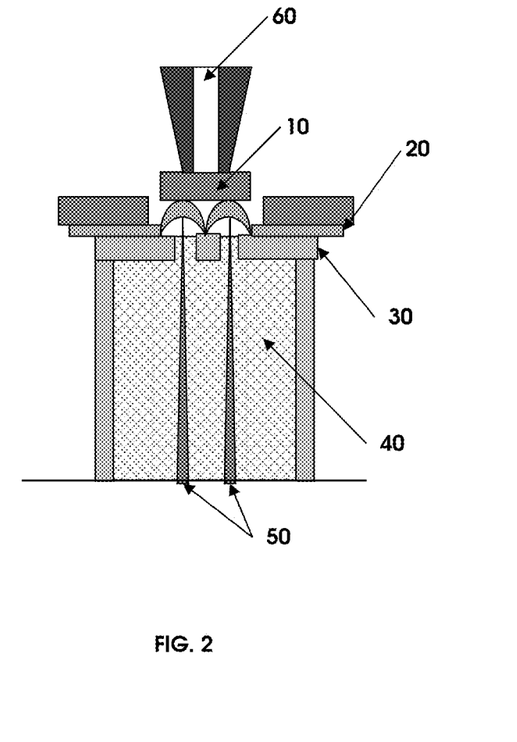
FIG. 2 is a schematic illustration of an arrangement in which ejector components are misaligned.

FIG. 2 is a schematic illustration of an arrangement in which heights of the ejector components 50 are misaligned. As shown in FIG. 2, misalignment of the heights of the ejector components 50 may be damaging to the dice 10 located on the support. Typically ejector components 50 are manufactured and assembled to high tolerance in order to control height variation between the multiple ejector components. Despite high manufacturing and assembly tolerance, it is possible that the ejector components 50 may become misaligned. Misalignment of ejector components 50 can cause an unbalanced force to be exerted upon UV tape 20 and consequently the individual die 10. It will be appreciated that misaligned ejector components can lead to various disadvantages in operation of a die ejector apparatus including, for example: pick-up position offset, tilting, and die cracking.

Arrangements in accordance with the present invention seek to provide a method to accurately assess any misalignment and thereby allow for realignment of the ejector components through appropriate adjustment. That adjustment may, for example, comprise manual height adjustment of the individual ejector components relative to one another, or may, for example, comprise automatic height adjustment of the ejector components. Accurate assessment of misalignment can avoid a need for an operator to visually assess alignment before manually adjusting ejector component heights. Such user visual analysis may only occur if damage to dice has already occurred, or may only occur infrequently. A visual assessment of alignment and consequent manual realignment of ejector components is subjective and prone to user error. The resulting adjustments may still leave the ejector components 50 misaligned. Arrangements of the present invention recognise that visual inspection and adjustment by a user may be inaccurate and hard to reproduce.

Die Ejection Apparatus Operation

Figure 3A:
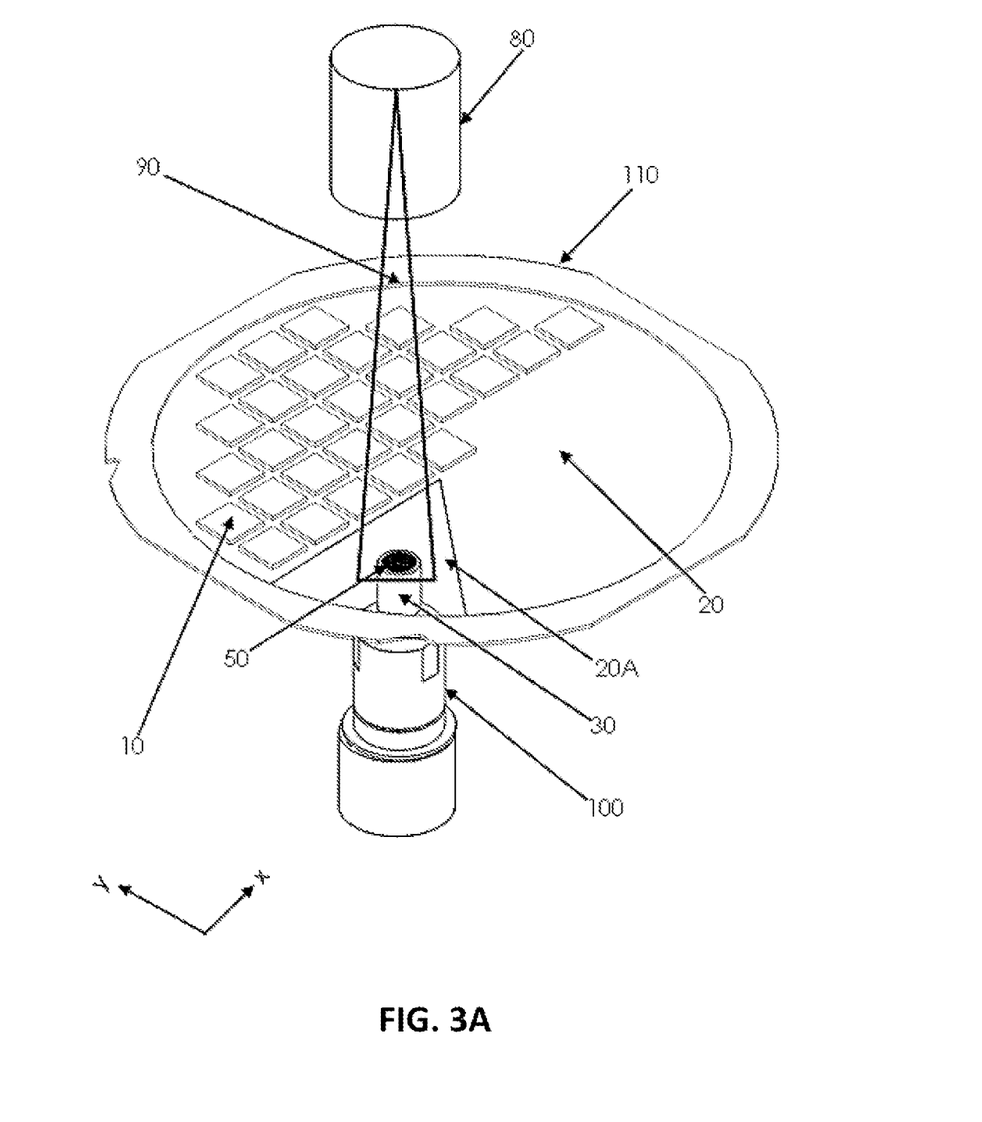
FIG. 3A is a perspective view of die ejection apparatus in operation in accordance with a method according to one embodiment.

FIG. 3 is a perspective view of an ejector module 100, operable to perform a method in accordance with one embodiment of the invention. The ejector module 100 shown in FIG. 3A comprises an ejector cap 30 including ejector components 50. The ejector module 100 is locatable beneath a ring support indicated generally as 110. That ring support 110 comprises UV tape 20 on which a plurality of individual die 10 are located. Also shown in this embodiment is a down-look camera 80 located above the ring support 110 and configured to image the die 10 on the ring support 110. That down-look camera 80 also includes a light source configured to illuminate a surface of the ring support 110 with coaxial light 90.

The ejector module 100 is generally configured to eject the die 10 from the UV tape 20. The ejector module 100 includes at least two ejector components 50 located within the ejector cap 30. Those ejector components 50 are configured to lift a die 10 located on the support as a result of being moveable between: a first position in which no lifting force is exertable by the ejector components 50 on the UV tape 20; and a second position in which a lifting force is exertable by the ejector components 50 on the support, so as to lift a die located on the support. The ejector module 100 shown in FIG. 3A is configured such that movement of the ejector components 50 from the first position to the second position is effected by a common motor and those ejector components are incrementally moved concurrently and in a synchronised manner from the first position to the second position.

The ejector module shown in FIG. 3A may be configured to perform a method in accordance with the present invention. Operation of the ejector module 100 is controlled by a control unit (not shown). The control unit may be configured to initiate movement of the die ejector components 50 from the first position towards the UV tape 20. A determination is made, as a result of observation of the UV tape 20 by the camera 80, of when each of the die ejector components 50 reaches the support. An evaluation is made, as a result of the determination, of a height offset of each die ejector component relative to a height of another die ejector component. Once the height offset is assessed, a method in accordance with the invention allows for adjustment of relative heights of the die ejector components 50 in dependence upon the evaluated height offset. That adjustment may, for example, comprise a manual adjustment of a position of one or more of the ejector components 50. Of course, the adjustment may, in some embodiments, comprise automatic independent adjustment of relative heights of ejector components.

Figure 3B:
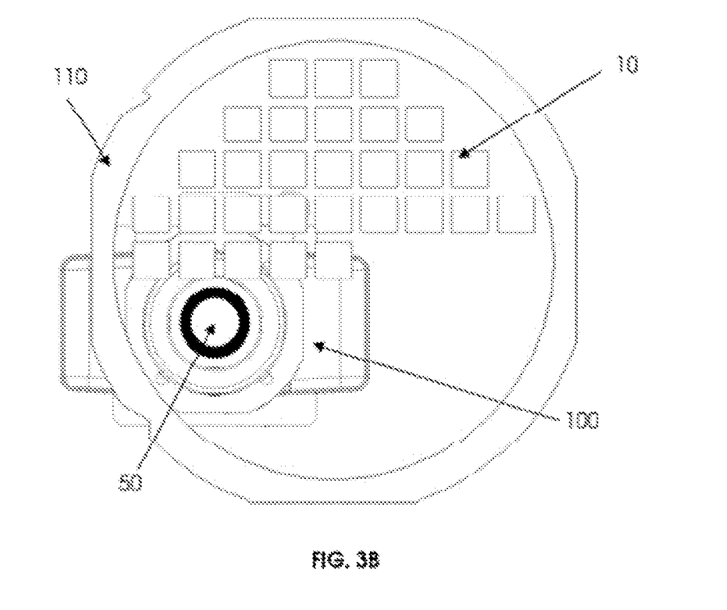
FIG. 3B is a plan view of a support and ejector module shown in perspective view in FIG. 3A.
Figure 3C:
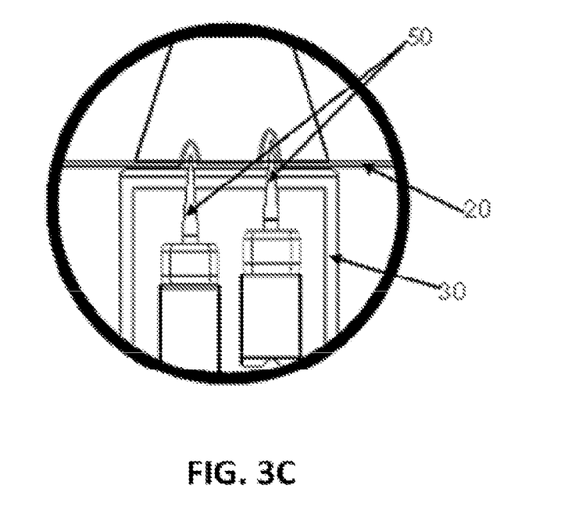
FIG. 3C is a partial side view of a portion of the ejector module in use.

In the embodiment illustrated in FIG. 3A to FIG. 3C, to perform a method in accordance with the present invention, the ejector module 100 is located beneath an area of the UV tape 20 on which no die 10 are located. A clear region 20A of the support can allow the down-look camera 80 to obtain an image of the ejector cap 30 and ejector components 50 unobstructed by any die located on the support. The image (s) obtained by the camera 80 as the ejector components 50 are moved towards the UV tape 20 can be used to determine any height offset between ejector components.

FIG. 3B is a plan view of the ring support 110 and ejector module 100 shown in perspective view in FIG. 3A. FIG. 3C is a partial side view of the ejector cap 30, UV tape 20 and ejector components 50 as they are moved from a position in which no contact with the UV tape is made, to a position in which contact with the UV tape is made. That process can be observed, from above, by the down-look camera 80.

Figure 4:
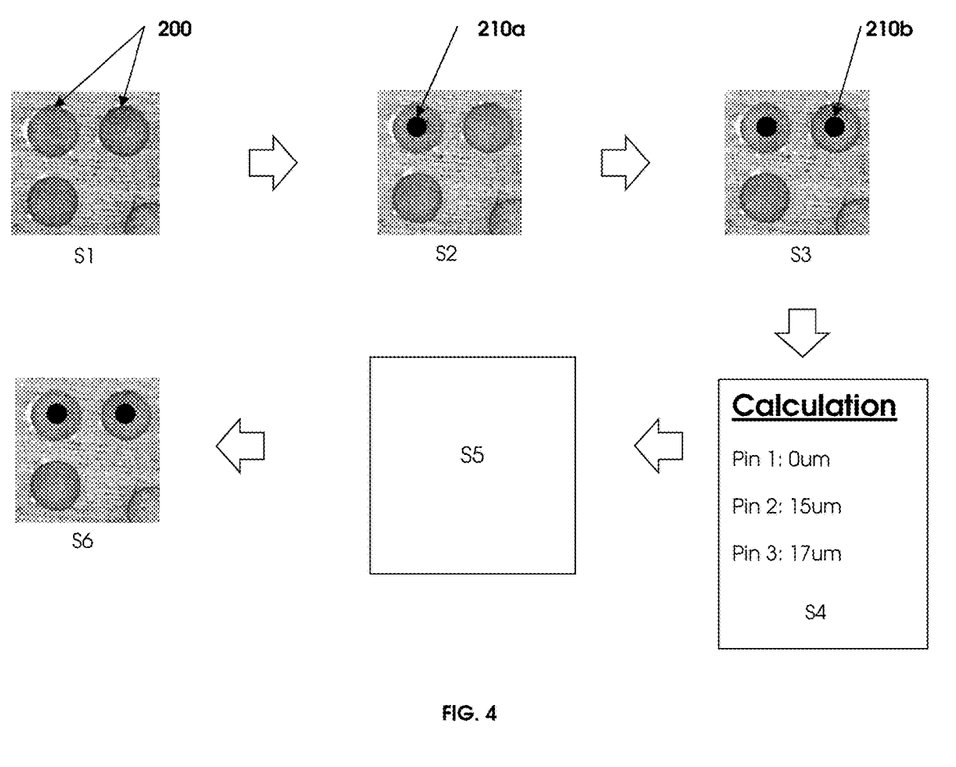
FIG. 4 is a schematic representation of a method in accordance with the invention.

FIG. 4 illustrates schematically steps of a method in accordance with one implementation of the invention. FIG. 4 shows a series of exemplary images captured by a down-look camera 80 located above an ejector cap 30 of an ejector module 100 as ejector components are moved from a first position towards the UV tape 20. The images captured and shown by way of example in FIG. 4 comprise images of ejector cap holes 200, wherein each ejector cap hole is configured to guide motion of an ejector component 50. The ejector components 50 are moveable through the ejector cap 30 and, in particular, through the ejector cap holes 200. At step S1 shown in FIG. 4, a system is configured such that a control unit initiates movement of the ejector module 100 to a blank area 20a of the support on which there are no dice located. The system is configured to capture an ejector cap image as shown in step S1 of FIG. 4 as an initial reference. Step S2 of a method in accordance with one embodiment occurs when movement of the ejector components 50 is initiated and the ejector pins or blades begin to incrementally abut against the UV tape 20 located within the ring support 110. The system is configured to capture the ejector cap image at each incremental step upwards of the ejector components 50. The system is further configured, in this embodiment, to "subtract" the initial image from the newly captured image. If the resulting subtracted ejector mark size within a cap hole area has exceeded or passed a threshold, the system is operable to save the ejector component location and the ejector encoded value; that is to say, how much that ejector pin has been incrementally moved from initiation of movement. It can be seen in step S2 of FIG. 4 that a first ejector component has reached that threshold value within an ejector cap hole 200. Step S3 of a method in accordance with one embodiment is such that incremental steps of movement of all the ejector components 50 towards the UV tape located on the ring support 110 continues.

Step S3 comprises ensuring that incremental steps are continued until all expected ejector components 50 are determined to have reached and abutted the UV tape 20, or until the ejector module has moved all ejector components to the maximum ejector level limit. Throughout this part of the method, subtraction of the initial image from the image obtained at each incremental step occurs to determine whether and when an ejector component is determined to have reached the UV tape 20. At step S3 shown in FIG. 4 it will be appreciated that two ejector components will be determined to have reached the UV tape 20. At step S4 of a method in accordance with one embodiment the incremental steps and offsets associated with those incremental steps are calculated such that offsets of heights between the plurality of ejector components can be determined. In the example shown in FIG. 4, if the first ejector component to reach the support is set as a reference value of 0, offsets in terms of distance between that reference component and the other components can be calculated by knowing the incremental steps in terms of distance magnitude associated with each increment of movement performed by the ejector module. Once those offsets have been calculated, it is possible to adjust, at step S5 of a method in accordance with an embodiment, the relative positions of the various ejector components. That adjustment may comprise manual adjustment or may occur automatically in the event that the ejector components are each associated with an individual actuator. A final optional stage of a method in accordance with one embodiment may occur at step 6 of FIG. 4, in which the adjusted ejector components 50 are checked for alignment by capturing an image of the wafer tape when the ejector components are in their initial position and incrementally moving those ejector components upwards, step by step, until they are determined to have reached the UV tape 20 at the same or substantially the same time. If adjustment has been successfully performed at step S5, on the basis of offsets calculated at step S4, all ejector components 50 ought to be determined to reach the UV tape at substantially the same incremental movement of the ejector components upwards towards the support.

Whilst described in terms of height or distance, it will be appreciated that an offset may also be calculated in terms of time, which may then be calculated to have a distance or height equivalent. Similarly, whilst all offsets are calculated as being positive compared to the first ejector component to reach the support, it is possible to choose a different ejector component as a reference and to allow for both positive and negative offsets.

A method in accordance with the invention may allow for assessment and correction of ejector components in-process, before a system enters an operational mode. That is to say, rather than being part of installation and commissioning of a system, the ejector module may be calibrated or adjusted as part of standard use. The height level health check in accordance with the invention may be performed automatically and frequently to avoid misalignment of ejector components and therefore minimise loss or damage to dice as a result of an ejection or lifting process.

The method described in relation to FIG. 3 and FIG. 4 may be used to allow for accurate manual adjustment of relative heights of ejector components. In some implementations, automatic adjustment of the relative position and heights of the ejector components may be supported. In such arrangements the control unit (not shown) may be configured to make an assessment of adjustments to be made to positioning of the ejector components as a result of the determined height offsets and to instruct operation of individual motors coupled to each of the individual ejector components to compensate for those determined height offsets and ensure all of the plurality of ejector components in use reach a support substantially simultaneously to exert a lifting force upon the support and therefore any die located on that support. In other words, embodiments in which individual motors for each ejector component are provided, a method in accordance with embodiments of the invention may allow for automated multipin or blade height adjustment based on the assessed offsets.

Figure 5:
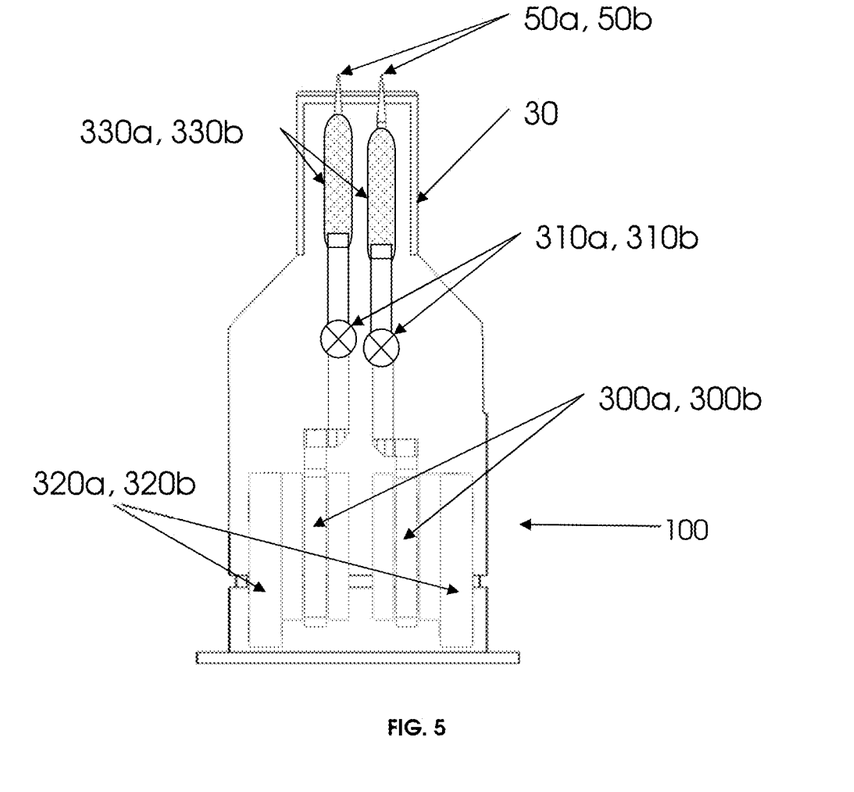
FIG. 5 is a cross-sectional view of an ejector module for use in a method in accordance with the invention.

FIG. 5 is a cross-sectional view of an ejector module configured for use in accordance with a method according to one embodiment of the invention. The ejector module 100 shown in FIG. 5 comprises an ejector cap 30 in which two ejector components 50a, 50b are located. Each of those ejector components 50a, 50b is associated with an ejector component chuck 330a, 330b coupled to an individual motor 300a, 300b via an ejector coupler 310a, 310b. Each ejector component 50a, 50b has an individual encoder 320a, 320b controlled by a control unit (not shown). It will be understood that the two-pin ejector system illustrated schematically in FIG. 5 may operate within the method described generally in relation to FIG. 4. In particular, the encoders and motors may be operable to simultaneously move ejector components 50A, 50B towards a ring support 110 holding UV tape 20 on which die 10 may be located. In accordance with the embodiment described in relation to FIG. 4, calibration of operation of the ejector module 100 shown in FIG. 5. may occur. The ejector module 100 is located beneath a blank section of the UV tape 20 and simultaneous movement of the ejector components 50A, 50B may be initiated, each being moved an equivalent incremental step by their appropriate couplers and VCM motors 300a, 300b as controlled by the encoders 320a, 320b. The down-look camera 80 (not shown in FIG. 5) is configured to obtain the images as described in relation to FIG. 4 and that information may be used by the control unit (not shown) to calculate a height offset between ejector components 50A, 50B when the ejector module 100 is operating in an uncalibrated state. Those calculated offsets may then be taken into account by the control unit and adjustment of the encoders and couplers instructed such that the heights of ejector components 50A, 50B are configured to be substantially identical at initiation of any movement towards the support and, more significantly, on reaching UV tape 20.

Figure 6A:
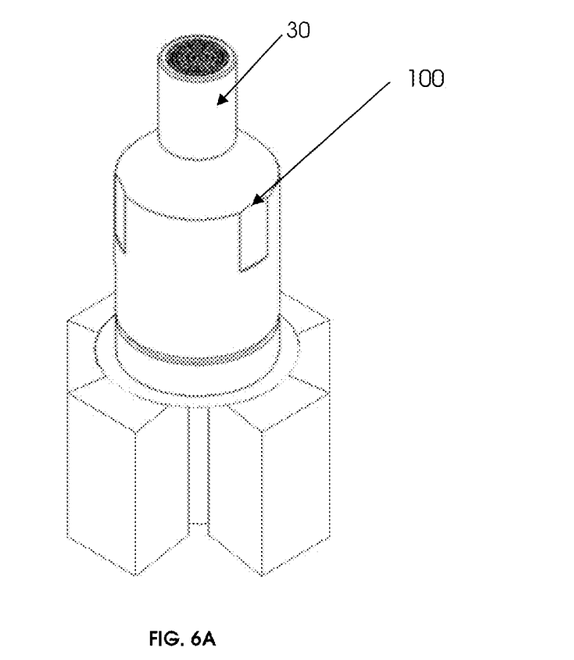
Figure 6B:
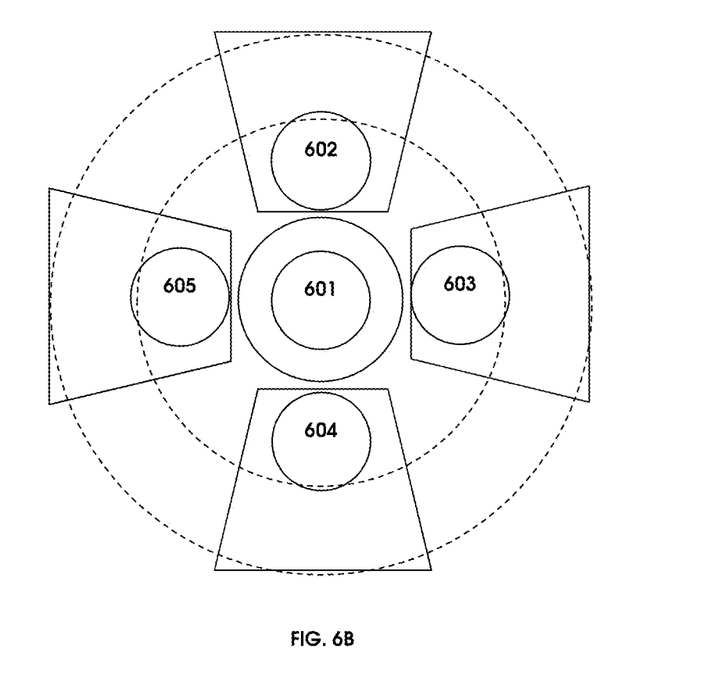
Figure 6C:
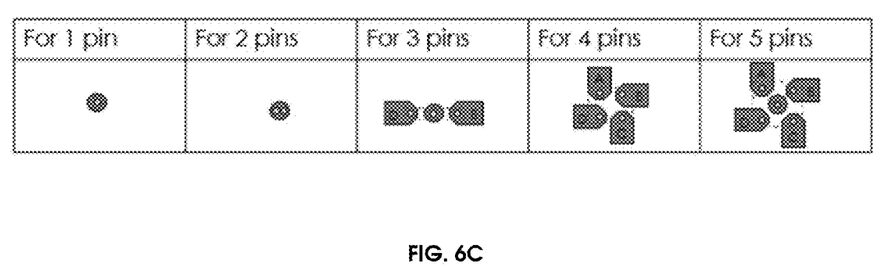

FIG. 6 illustrates schematically an alternative ejector module 100 for use in accordance with an embodiment of the invention. The ejector module 100 shown in FIG. 6A comprises five individually controllable motors, each with associated linear encoders. The locations of those motors are shown in plan view in FIG. 6B. It can be seen that those motors may be configured to move ejector components 50 through an ejector cap 30 towards a support to release a die from a support. Those individually controllable motors 601, 602, 603, 604, 605 forming part of the ejector module 100 are configured to allow for release of dice from a support using a variable number of ejector components 50. Such a variable number of ejector components can allow for release of differently dimensioned dice from a support. FIG. 6C illustrates schematically a possible arrangement for each of one through five ejector components exerting a lifting force on a die through ejector cap 30. It can be seen that for one or two pins, a single motor 601 may be used and, for example, in relation to two ejector components, manual adjustment of the two ejector components 50 may occur since they are actuated by the same motor 601. In relation to three ejector components, three separate motors 605, 601, 603, or 602, 601, 604, may be used and therefore automatic adjustment of the ejector components in dependence upon a calculated offset may occur. In relation to four ejector components, it may be possible to use motors 602, 603, 604 and 605 and the ejector components 50 associated with motor 601 may not be used. In a five ejector component arrangement, all of motors 601 through 605 may be used and automatic adjustment in accordance with calculated offsets may be implemented automatically.

Embodiments described may provide means for detection of height variation in ejector components by monitoring an impression made on a blank portion of wafer tape by those ejector components. Detection of height variation and therefore relative height offset between ejector components can be conducted by moving ejector components upwards gradually whilst viewing marks appearing on the opposite side of the tape by a down-look camera 80. It will be appreciated that the higher the ejector component, the earlier the mark appears and vice versa. Embodiments may also provide that after calculation of height variation, the heights of the ejector components may be equalized automatically by raising or lowering individual ejector components automatically through use of individual motorized mechanisms. That equalization and adjustment occurs until the heights of the various ejector components are determined to be at the same level. The height detection step may be repeated thereafter for verification as described.

Although the present has been described in considerable detail with reference to certain embodiments, other embodiments are possible. Therefore, the spirit and scope of the appended claims should not be limited to the particular description of the embodiments contained herein.

The invention claimed is:

1. A method of adjusting a die ejection apparatus operable to eject a die from a support, the method comprising:
providing a die ejection apparatus comprising at least two ejector components configured to lift a die located on the support, the ejector components being moveable between:
a first position in which no lifting force is exertable by the ejector components on the support; and
a second position in which a lifting force is exertable by the ejector components on the support, so as to lift a die located on the support in use;
said method comprising:
providing a support over the die ejection apparatus;
initiating movement of the die ejector components from the first position towards the second position such that the die ejector components exert the lifting force on the support;
determining when each of the die ejector components reaches the second position from the first position;
evaluating a height offset of each die ejector component relative to a height of another die ejector component upon reaching the second position from the first position; and
adjusting relative heights of the die ejector components in dependence upon the evaluated height offset.

2. The method according to claim 1, wherein adjusting the relative heights of the die ejector components in dependence upon the evaluated height offset comprises:
applying an alignment correction calculated from said evaluated height offset to substantially align the height of an operative surface of the ejector components before initiating any lifting of the die located on the support in use.

3. The method according to claim 1, wherein adjusting the relative heights of the die ejector components in dependence upon the evaluated height offset comprises:
controlling the subsequent movement of the die ejector components such that the die ejector components reach the second position from the first position substantially simultaneously.

4. The method according to claim 1, wherein the height of the operative surface of each of the die ejector components is independently adjustable.

5. The method according to claim 1, wherein adjusting the relative heights of the die ejector components in dependence upon the evaluated height offset comprises:
manually adjusting a mount for the die ejector components to change a height of one or more of the die ejector components relative to another ejector component.

6. The method according to claim 1, wherein adjusting the relative heights of the die ejector components in dependence upon the evaluated height offset comprises:

automatic adjustment of position of one or more of the die ejector components with motors coupled to the die ejector components.

7. The method according to claim 6, wherein each of the die ejector components is coupled to a separate motor.

8. The method according to claim 1, wherein the method further comprises:
after adjusting the relative heights of the die ejector components in dependence upon the evaluated height offset, initiating movement of the adjusted die ejector components from the first position to assess whether each of the die ejector components reaches the second position from the first position concurrently to determine a height offset therebetween; and thereafter,
repeating the determining, evaluating and adjusting steps if a height offset is detected.

9. The method according to claim 1, wherein determining when each of the die ejector components reaches the second position comprises:
monitoring a deformation of the support caused by each die ejector component at the second position.

10. The method according to claim 1, wherein monitoring comprises:
optically monitoring the imprint made by each die ejector component at the second position on a region of the support.

11. The method according to claim 10, wherein monitoring comprises:
imaging a known region of the support prior to initiation of movement of any of the die ejector components from the first position to obtain an initial image;
initiating movement of the die ejector components from the first position towards the support;
imaging the known region of the support as the die ejector components move to the second position;
comparing the obtained image to the initial image and further comparing the respective imprints made by each of the die ejector components on the support for determining their relative heights.

12. The method according to claim 1, wherein adjusting the relative heights of the die ejector components comprises:
controlling subsequent movement of the die ejector components from the first position to the second position relative to one another.

13. The method according to claim 12, wherein controlling subsequent movement of the die ejector components comprises:
controlling a speed of movement of each independently controllable die ejector component between the first and second positions to account for the evaluated height offset such that the ejector components concurrently reach the second position.

14. The method according to claim 12, wherein controlling subsequent movement of the die ejector components comprises:
controlling a time of initiation of movement of each independently controllable die ejector component between the first and second positions.

15. The method according to claim 12, wherein controlling subsequent movement of the die ejector components comprises:
preventing movement of at least one independently controllable die ejector component until it is aligned with movement of the other die ejector components between the first and second positions to account for the evaluated height offset such that the ejector components concurrently reach the second position.

* * * * *